United States Patent
Yoon et al.

(10) Patent No.: US 9,590,203 B2
(45) Date of Patent: *Mar. 7, 2017

(54) ORGANIC LIGHT-EMITTING DEVICE (71) Applicant: SAMSUNG DISPLAY CO., LTD., Yongin, Gyeonggi-Do (KR)

(72) Inventors: Seok-Gyu Yoon, Yongin (KR); Dong-Chan Kim, Yongin (KR); Won-Jong Kim, Yongin (KR); Eung-Do Kim, Yongin (KR); Dong-Kyu Seo, Yongin (KR); Young-Woo Song, Yongin (KR); Da-Hea Im, Yongin (KR); Bo-Ra Jung, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 72 days.

This patent is subject to a terminal disclaimer.

(21) Appl. No.: 14/550,104

(22) Filed: Nov. 21, 2014

(65) Prior Publication Data
US 2015/0364715 A1    Dec. 17, 2015

(30) Foreign Application Priority Data
Jun. 17, 2014    (KR) .................. 10-2014-0073674

(51) Int. Cl.
    *H01L 51/00*      (2006.01)
    *H01L 51/52*      (2006.01)
    *H01L 27/32*      (2006.01)

(52) U.S. Cl.
    CPC ...... *H01L 51/5234* (2013.01); *H01L 27/3211* (2013.01); *H01L 27/3213* (2013.01);
(Continued)

(58) Field of Classification Search
    CPC ............ H01L 27/3213; H01L 51/5206; H01L 51/5221; H01L 27/3211; H01L 51/5225; H01L 51/5218; H01L 51/5234
(Continued)

(56) References Cited

U.S. PATENT DOCUMENTS

| | | | |
|---|---|---|---|
| 6,358,631 B1 * | 3/2002 | Forrest | .................. C09K 11/06 257/E33.056 |
| 9,099,416 B2 * | 8/2015 | Jung | ................... H01L 27/3211 |

(Continued)

FOREIGN PATENT DOCUMENTS

| KR | 10-2003-0021580 A | 3/2003 |
|---|---|---|
| KR | 10-2008-0056444 A | 6/2008 |

(Continued)

*Primary Examiner* — Victoria K Hall
(74) *Attorney, Agent, or Firm* — Lee & Morse, P.C.

(57) ABSTRACT

An organic light-emitting device with a plurality of subpixels, each subpixel including an emission region and a non-emission region, the organic light-emitting device including a substrate; an anode on the substrate, the anode including patterns that separately correspond to respective ones of the plurality of subpixels; an organic layer on the anode, the organic layer being common to the plurality of subpixels; and a cathode on the organic layer, the cathode including a plurality of subcathodes that each correspond to at least one of the subpixels and that allow light to pass through in emission regions, wherein adjacent two of the subcathodes overlap with each other in non-emission regions.

20 Claims, 6 Drawing Sheets (52) U.S. Cl.
   CPC ...... *H01L 51/5206* (2013.01); *H01L 51/5218* (2013.01); *H01L 51/5221* (2013.01); *H01L 51/5225* (2013.01)

(58) Field of Classification Search
   USPC .......................................................... 313/505
   See application file for complete search history.

(56) References Cited

U.S. PATENT DOCUMENTS

| | | | | |
|---|---|---|---|---|
| 9,466,647 | B2* | 10/2016 | Na .................... | H01L 27/3241 |
| 2005/0037232 | A1 | 2/2005 | Tyan et al. | |
| 2006/0145159 | A1* | 7/2006 | Yokoyama .......... | H01L 51/5218 257/72 |
| 2007/0057264 | A1* | 3/2007 | Matsuda ............. | H01L 27/3211 257/88 |
| 2007/0102714 | A1* | 5/2007 | Lee .................... | H01L 27/3211 257/88 |
| 2010/0181904 | A1* | 7/2010 | Yoshizaki ........... | H01L 27/3276 313/504 |
| 2011/0084291 | A1* | 4/2011 | Jeong ................. | H01L 27/3211 257/89 |
| 2011/0129779 | A1* | 6/2011 | Lee .................... | B41M 5/38214 430/312 |
| 2011/0248309 | A1 | 10/2011 | Han et al. | |
| 2012/0025192 | A1* | 2/2012 | Shimizu .............. | H01L 27/3211 257/59 |
| 2012/0313099 | A1 | 12/2012 | Chung et al. | |
| 2013/0043498 | A1* | 2/2013 | Pyo .................... | H01L 51/0013 257/89 |
| 2013/0048986 | A1* | 2/2013 | Lee .................... | H01L 51/5265 257/52 |
| 2013/0187131 | A1* | 7/2013 | Chung ................ | H01L 27/326 257/40 |
| 2014/0183461 | A1* | 7/2014 | Kim ................... | H01L 51/56 257/40 |
| 2015/0048335 | A1* | 2/2015 | Chung ................ | H01L 27/3267 257/40 |
| 2015/0097168 | A1* | 4/2015 | Hanawa .............. | H01L 51/5271 257/40 |
| 2015/0102305 | A1* | 4/2015 | Jung .................. | H01L 27/3211 257/40 |
| 2015/0208480 | A1* | 7/2015 | Hosokawa .......... | H01L 27/3209 315/294 |
| 2016/0300888 | A1* | 10/2016 | Wang ................. | H01L 27/322 |

FOREIGN PATENT DOCUMENTS

| | | | |
|---|---|---|---|
| KR | 10-2011-0113556 A | 10/2011 | |
| KR | 10-2012-0134464 A | 10/2012 | |
| KR | 10-1275810 * | 6/2013 | ............ H01L 51/50 |

* cited by examiner

ORGANIC LIGHT-EMITTING DEVICE

CROSS-REFERENCE TO RELATED APPLICATION

Korean Patent Application No. 10-2014-0073674, filed on Jun. 17, 2014, in the Korean Intellectual Property Office, and entitled: "Organic Light-Emitting Device," is incorporated by reference herein in its entirety.

BACKGROUND

1. Field

Embodiments relate to an organic light-emitting device.

2. Description of the Related Art

Organic light-emitting diodes or devices (OLEDs), which are self-emitting devices, may have advantages such as wide viewing angles, excellent contrast, high brightness, low driving voltage, and quick response characteristics, and may provide multicolored images. Due to these characteristics OLEDs have been receiving growing attention for use in displays or lighting equipment.

SUMMARY

Embodiments are directed to an organic light-emitting device.

The embodiments may be realized by providing an organic light-emitting device with a plurality of subpixels, each subpixel including an emission region and a non-emission region, the organic light-emitting device including a substrate; an anode on the substrate, the anode including patterns that separately correspond to respective ones of the plurality of subpixels; an organic layer on the anode, the organic layer being common to the plurality of subpixels; and a cathode on the organic layer, the cathode including a plurality of subcathodes that each correspond to at least one of the subpixels and that allow light to pass through in emission regions, wherein adjacent two of the subcathodes overlap with each other in non-emission regions.

The subcathodes may each have a thickness of about 60 Å to about 200 Å.

The subcathodes may include silver (Ag), magnesium-silver (Mg—Ag), magnesium (Mg), magnesium-indium (Mg—In), aluminum (Al), aluminum-lithium (Al—Li), lithium (Li), calcium (Ca), or a transparent conductive metal oxide.

The subcathodes may include silver.

The anode may be a reflective electrode or a semi-transmissive electrode.

The plurality of subpixels may include a red subpixel, a green subpixel, and a blue subpixel.

The embodiments may be realized by providing an organic light-emitting device with a plurality of subpixels, each subpixel including an emission region and a non-emission region, the organic light-emitting device including a substrate; a cathode on the substrate, the cathode including a plurality of subcathodes that each correspond to at least one the subpixels and that allow light to pass through in the emission regions, wherein adjacent two of the subcathodes overlap with each other in the non-emission regions; an organic layer on the cathode, the organic layer being common to the plurality of subpixels; and an anode on the substrate, the anode including patterns that separately correspond to respective ones of the plurality of subpixels.

The subcathodes may each have a thickness of about 60 Å to about 200 Å.

The subcathodes may include silver (Ag), magnesium-silver (Mg—Ag), magnesium (Mg), magnesium-indium (Mg-In), aluminum (Al), aluminum-lithium (Al—Li), lithium (Li), calcium (Ca), or a transparent conductive metal oxide.

The anode may be a reflective electrode or a semi-transmissive electrode.

The embodiments may be realized by providing an organic light-emitting device with a plurality of subpixels, each subpixel including an emission region and a non-emission region, the organic light-emitting device including a substrate; an anode on the substrate; an organic layer on the anode, the organic layer emitting white light; and a cathode on the organic layer, the cathode corresponding to at least one of the pixels and allowing light to pass through in the emission regions, wherein the cathode overlaps with another adjacent cathode in the non-emission region.

The cathode may include silver (Ag), magnesium-silver (Mg—Ag), magnesium (Mg), magnesium-indium (Mg—In), aluminum (Al), aluminum-lithium (Al—Li), lithium (Li), calcium (Ca), or a transparent conductive metal oxide.

The anode may be a reflective electrode or a semi-transmissive electrode.

The organic layer may include a single emission layer emitting white light.

The organic layer may include a plurality of emission layers emitting light of different colors, and a combination of the light of different colors emitted from the plurality of emission layers may be white light.

The organic layer may include a plurality of emission units, and an intermediate connection layer between the plurality of emission layers, and white light is emitted by combination of different-color lights emitted from the plurality of emission units.

The embodiments may be realized by providing an organic light-emitting device with a plurality of subpixels, each subpixel including an emission region and a non-emission region, the organic light-emitting device including a substrate; a cathode on the substrate, the cathode corresponding to at least one of the pixels and allowing light to pass through in the emission regions, wherein the cathode overlaps with another adjacent cathode in the non-emission regions; an organic layer on the cathode, the organic layer emitting white light; and an anode on the organic layer.

The organic layer may include a single emission layer emitting white light.

The organic layer may include a plurality of emission layers emitting light of different colors, and a combination of the light of different colors emitted from the plurality of emission layers may be white light.

The organic layer may include a plurality of emission units, and an intermediate connection layer between the plurality of emission layers, white light being emitted by combination of different-color lights emitted from the plurality of emission units.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

Figure 1:
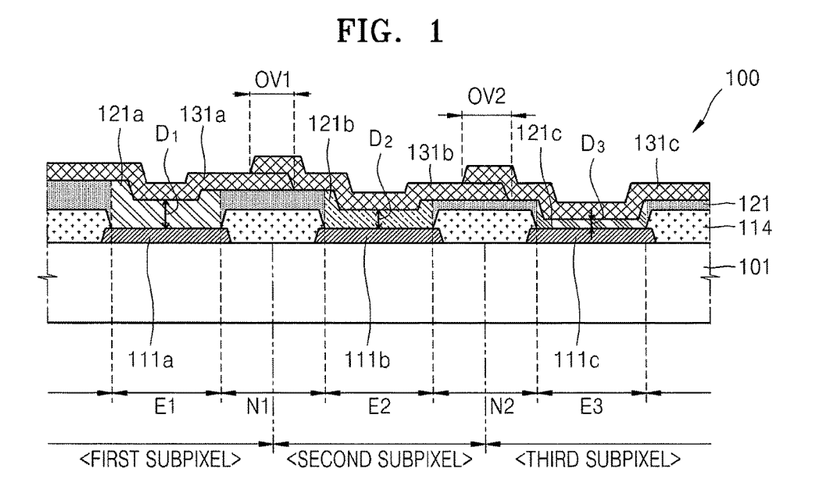
FIG. 1 illustrates a schematic cross-sectional view of an organic light-emitting device according to an embodiment.

FIG. 1 illustrates a schematic cross-sectional view of an organic light-emitting device 100 according to an embodiment. Referring to FIG. 1, the organic light-emitting device 100 may include a first subpixel, a second subpixel, and a third subpixel, which include emission regions E1, E2, and E3, and non-emission regions N1 and N2, respectively. The emission regions E1, E2, and E3, which are also collectively referred to herein as an emission region E, are regions in which light is emitted. The non-emission regions N1 and N2, which are also collectively referred to herein as a non-emission region N, is a region excluding or other than the emission region E. The organic light-emitting device 100 may include a substrate 101, an anode (patterned to correspond to or be in the first, second, and third subpixels), and an organic layer 121 and a cathode that are common to the first, second, and third subpixels. The cathode may include subcathodes 131a, 131b, and 131c that correspond to the first, second, and third subpixels, respectively. The subcathodes 131a, 13lb, and 131c may overlap with one another in the non-emission regions N (e.g., non-emission regions N1 and N2).

The organic light-emitting device 100 may emit a first color light in the first subpixel, a second color light in the second subpixel, and a third color light in the third subpixel. A mixed light of the first color light, second color light, and third color light may be white light. For example, the organic light-emitting device 100 may emit full-color light.

The substrate 101 may be a suitable or common substrate used for organic light-emitting devices. The substrate may be, e.g., a glass or transparent plastic substrate with good mechanical strength, thermal stability, transparency, surface smoothness, ease of handling, and water resistance.

The anode on the substrate 101 may be a pattern of anodes 111a, 111b, and 111c that correspond to, are a part of, or are in the first, second, and third subpixels, respectively. The anode may be a reflective electrode or a semi-transmissive electrode.

The anode may be formed by depositing or sputtering an anode material on the substrate. The material for the anode may be selected from materials that have a high work function, e.g., a material having a work function of about 4.6 eV or greater, to facilitate injection of holes.

To form a reflective electrode, the anode may include at least one metal, e.g., silver (Ag), magnesium-silver (Mg—Ag), magnesium (Mg), magnesium-indium (Mg—In), aluminum (Al), aluminum-lithium (Al—Li), lithium (Li), or calcium (Ca). The anode may have, e.g., a thickness of about 2,000 Å. In an implementation, the anode may be formed by deposition of a metal as described above, or a metal oxide such as ITO, IZO, $SnO_2$, and ZnO. However, the anode may be formed in various different ways, not limited to the above. The anode may have a single-layer structure or a multi-layer structure. For example, the anode may have a three-layered structure of ITO/Ag/ITO.

When the anode is a reflective electrode, the organic light-emitting device 100 may be a top-emission organic light-emitting device. When the anode is a semi-transmissive electrode, the organic light-emitting device 100 may be a both-side (double-sided) light-emitting device.

A pixel defining layer 114 may be disposed in an edge region of each of the anodes, e.g., on the pattern of anodes 111a, 111b, and 111c. The pixel defining layers 114 may define subpixel regions (the first, second, and third subpixels), and may include a suitable organic insulating material, inorganic insulating material, or organic/inorganic composite insulating material. For example, the pixel defining layer 114 may be formed of an organic material, e.g., a photoresist, a polyacrylic resin, or a polyimide-based resin; an inorganic material, e.g., a silicon oxide, a silicon nitride, or an aluminum oxide; or an organic/inorganic composite material.

The organic layer 121 may be disposed on the anode. The organic layer 121 may include a low molecular weight organic material or a high molecular weight organic material. The organic layer 121 may include an emission layer (EML). In an implementation, the organic layer 121 may further include at least one layer of a hole injection layer (HIL), a hole transport layer (HTL), a buffer layer, an electron blocking layer (EBL), a hole blocking layer (HBL), an electron transport layer (ETL), and an electron injection layer (EIL). Some of these layers may further include an inorganic material, in addition to such an organic material as described above. These layers may be formed by any of a variety of suitable methods, including vacuum deposition, spin coating, casting, and Langmuir-Blodgett (LB) deposition.

Examples of a material for the HIL may include phthalocyanine compounds such as copper phthalocyanine; diamine or triamine compounds, such as DNTPD (N,N'-diphenyl-N,N'-bis-[4-(phenyl-m-tolyl-amino)-phenyl]-biphenyl-4,4'-diamine), m-MTDATA (4,4',4"-tris(3-methylphenylphenylamino)triphenylamine), TDATA (4,4',4''-tris (N,N-diphenylamino)triphenylamine), 2T-NATA (4,4',4''-tris{N,-(2-naphthyl)-N-phenylamino}-triphenylamine); and polymer compounds, such as PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/camphor sulfonic acid), and PANI/PSS (polyaniline)/poly(4-styrenesulfonate).

Examples of a material for the HTL may include carbazole derivatives, such as N-phenylcarbazole and polyvinylcarbazole; triphenylamine-based compounds, such as TPD (N,N'-bis(3-methylphenye-N,N'-diphenyl-[1,1-biphenyl]-4, 4'-diamine), TCTA (4,4',4''-tris(N-carbazolyl) triphenylamine), and NPB (N,N'-di(1-naphthyl)-N,N'-diphenylbenzidine).

A material for the EML may include at least one of suitable light-emitting materials (including hosts and dopants).

Examples of a host for the EML may include $Alq_3$ (tris(8-quinolinolate)aluminum), CBP (4,4'-bis(N-carbazolyl)-1,1'-biphenyl) PVK (poly(n-vinylcabazole), ADN (9,10-di(naphthalene-2-yl)anthracene), TCTA (4,4',4''-Tris (carbazol-9-yl)-triphenylamine), TPBI (1,3,5-tris(N-phenylbenzimidazole-2-yl)benzene), TBADN (3-tert-butyl-9,10-di (naphth-2-yl) anthracene, DSA (distyrylarylene), E3, or CDBP (4,4'-bis(9-carbazolyl)-2,2'-dimethyl-biphenyl.

The dopant for the EML may be a suitable dopant, e.g., at least one of a fluorescent dopant and a phosphorescent dopant. For example, the phosphorescent dopant may include an organometallic complex including at least one selected from among iridium (Ir), platinum (Pt), osmium (Os), rhenium (Re), titanium (Ti), zirconium (Zr), hafnium (Hf), and a combination of at least two thereof.

Examples of suitable red dopants may include PtOEP (Pt(II) octaethylporphine, $Ir(piq)_3$ (tris(2-phenylisoquinoline)iridium, $Btp_2Ir(acac)$ (bis(2-(2'-benzothienyl)-pyridinato-N,C3')iridium(acetylacetonate), and bis(2-(2'-benzothienyl)-pyridinato-N,C3')iridium(acetylaetonate).

Examples of suitable green dopants are $Ir(ppy)_3$ (tris(2-phenylpyridine)iridium), $Ir(ppy)_2(acac)$ (bis(2-phenylpyridine)(acetylacetonato)iridium(III), $Ir(mppy)_3$ (tris(2-(4-tolyl)phenylpiridine)iridium), and C545T (10-(2-benzothiazolyl)-1,1,7,7-tetramethyl-2,3,6,7-tetrahydro-1H, 5H,11H-[1]benzopyrano[6,7,8-ij]-quinolizin-11-one).

Examples of suitable blue dopants are $F_2Irpic$ (bis[3,5-difluoro-2-(2-pyridyl)phenyl](picolinato)iridium(III)), $(F_2ppy)_2Ir(tmd)$, $Ir(dfppz)_3$, DPVBi (4,4'-bis(2,2'-diphenylethen-1-yl)biphenyl), DPAVBi (4,4'-bis[4-(diphenylamino) styryl]biphenyl), and TBPe (2,5,8,11-tetra-tert-butyl perylene).

Examples of a suitable material for the ETL may include $Alq_3$, BCP (2,9-dimethyl-4,7-diphenyl-1,10-phenanthroline), Bphen (4,7-diphenyl-1,10-phenanthroline), TAZ (3-(4-niphenylyl)-4-phenyl-5-tert-butylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3, 4-oxadiazole), BAlq (bis(2-methyl-8-quinolinolato-N1,O8)-(1,1'-biphenyl-4-olato)aluminum), $Bebq_2$ (beryllium bis (benzoquinolin-10-olate), and ADN (9,10-di(naphthalene-2-yl)anthrascene).

A material for the EIL may include, e.g., LiF, NaCl, CsF, $Li_2O$, BaO, or LiQ.

In an implementation, the EML may be patterned to correspond to the first subpixel, the second subpixel, and the third subpixel. In an implementation, each of the HIL, HTL, buffer layer, EBL, EML, HBL, and ETL may be formed as a common layer to the first, second, and third subpixels, or as a pattern of individual layers that respectively correspond to the first, second, and third subpixels.

As used herein, the term "common layer" refers to a layer that is disposed over the entire first, second, and third subpixels, and not patterned into individual or discontinuous layers respectively corresponding to the first, second, and third subpixels. Some of the layers that form the organic layer 121 (for example, the EML or a layer for ensuring a resonance distance) may be individual layers respectively corresponding to the first, second, and third subpixels, while the other layers of the organic layer 121 may be common layers to the entire first, second, and third subpixels. In the embodiment of FIG. 1, the organic layer 121 is represented as a common layer.

The organic layer 121 may include a first emission unit 121a of the first subpixel, a second emission unit 121b of the second subpixel, and a third emission unit 121c of the third subpixel. For example, the first emission unit 121a may emit red light, the second emission unit 121b may emit green light, and the third emission unit 121c may emit blue light. However, embodiments are not limited thereto.

In the organic light-emitting device 100 of FIG. 1, $D_1$ denotes a distance between the anode 111a and the sub cathode 131a in the first subpixel, $D_2$ denotes a distance between the anode 111b and the sub cathode 131b in the second subpixel, and $D_3$ denotes a distance between the anode 111c and the sub cathode 131c in the third subpixel. The distances $D_1$, $D_2$, and $D_3$ may be each independently determined depending on a total thickness of the layers in the organic layer 121 of the corresponding subpixel. For example, the distances $D_1$, $D_2$, and $D_3$ may be controlled by varying the thickness of the HTL or buffer layer in the corresponding first, second, and third subpixels, respectively. When the first emission unit 121a emits red light, the second emission unit 121b emits green light, and the third emission unit 121c emits blue light, the distances $D_1$, $D_2$, and $D_3$ in the organic light-emitting device 100 may satisfy, e.g., the condition that $D_1 \geq D_2 \geq D_3$, as illustrated in FIG. 1. When the organic light-emitting device 100 satisfies the condition that $D_1 \geq D_2 \geq D_3$, a resonance distance for a wavelength of each of first color light, second color light, and third color light may be ensured in each of the first, second, and third subpixels, and thus the organic light-emitting device 100 may have improved emission efficiency.

The cathode may be disposed on the organic layer 121. The cathode may include the first, second and third subcathodes 131a, 131b, and 131c that are overlapped and that correspond to the first, second, and third subpixels, respectively. The subcathodes 131a, 131b, and 131c may be formed by, e.g., deposition or sputtering.

Edge portions of the adjacent first and second sub cathodes 131a and 131b may overlap to form an overlapping region OV1 in the non-emission region N1. Similarly, edge portions of the adjacent second and third sub cathodes 131b and 131c may overlap to form an overlapping region OV2 in the non-emission region N2. The edge portion of the first sub cathode 131a may extend into the non-emission region N1 in the second subpixel, and not into the emission region E2 of the second subpixel. Similarly, opposite edge portions of the second subcathode 131b may extend into the non-emission region N1 in the first subpixel and the non-emission region N2 in the third subpixel, respectively, but not into the emission regions E1 and E3 of the respective first and third subpixels. Similarly, an edge portion of the third sub cathode 131c may extend into the non-emission region N2 in the second subpixel, but not into the emission region E2 of the second subpixel.

The first, second, and third subcathodes 131a, 131b, and 131c of the respective first, second, and third subpixels may be formed using a mask having an opening or openings that may expose from the emission region E1, E2, or E2 of the corresponding subpixel into at least part of the non-emission region N1 or N2 of the adjacent subpixel. For example, the first sub cathode 131a may be formed using a first mask, the second sub cathode 131b may be formed using a second mask, and the third sub cathode 131c may be formed using a third mask. An opening of the first mask may expose the emission region E1 and a part of the non-emission region N1 of the first subpixel, an opening of the second mask may expose the emission region E2 and a part of the non-emission region N2 of the second subpixel, and an opening of the third mask may expose the emission region E3 and a part of the non-emission region of the third subpixel. When the first, second, and third subcathodes 131a, 131b, and 131c are sequentially formed, the second subcathode 131b may overlap upon or overlie the first subcathode 131a in the non-emission region N1 of the corresponding first subpixel, and the third subcathode 131c may overlap upon or overlie the second subcathode 131b in the non-emission region N2 of the corresponding second subpixel.

The order of forming the first, second, and third subcathodes 131a, 131b, and 131c may be varied in different ways. For example, the second subcathode 131b or the third subcathode 131c may be formed earlier than the other subcathodes. As a result, for example, the edge portion of the first subcathode 131a may underlie the edge portion of the second subcathode 131b, or the edge portion of second subcathode 131b may underlie the edge portion of the third subcathode 131c.

The first, second, and third subcathodes 131a, 131b, and 131c may be formed of a same material. In an implementation, a material for the cathode (first, second, and third subcathodes 131a, 131b, and 131c) may include a metal, e.g., silver (Ag), magnesium-silver (Mg—Ag), magnesium (Mg), magnesium-indium (Mg—In), aluminum (Al), aluminum-lithium (Al—Li), lithium (Li), or calcium (Ca). In an implementation, the material for the cathode (first, second, and third subcathodes 131a, 131b, and 131c) may further include, e.g., a rare earth metal, an alkali metal, an alkali earth metal, or an oxide thereof.

The first, second, and third subcathodes 131a, 131b, and 131c may be formed of the above-described materials to have a small thickness to be semi-transmissive electrodes. In an implementation, the first, second, and third subcathodes 131a, 131b, and 131c may have a thickness of about 60 Å to 200 Å, e.g., the first, second, and third subcathodes 131a, 131b, and 131c may each independently have a thickness of about 60 Å to 200 Å. In this case, the cathode may allow light to pass through in the emission regions E1, E2, and E3. However, in the non-emission region N1 and N2 where the first, second, and third subcathodes 131a, 131b, and 131c overlap, the cathode may have a thickness of about 120 Å to about 400 Å, which is about two times greater than the thickness of the subcathodes in the emission regions El, E2, and E3, and thus may have a reduced sheet resistance.

In an implementation, the first, second, and third subcathodes 131a, 131b, and 131c may have different thicknesses. For example, when the first subpixel emits red light, the second subpixel emits green light, and the third subpixel emits blue light, the thickness of the third subcathode 131c may be formed to be larger than the thickness of the first subcathode 131a and the thickness of the second subcathode 131b. The thickness of the first subcathode 131a may be larger than the thickness of the second subcathode 131b. The larger the thickness of the cathode becomes, the larger the reflectivity of light emitted from the organic layer may become in the cathode, and consequently the larger the intensity of light generated by resonance may become. The emission efficiency of blue light may be lower than the emission efficiency of red light or green light, a subcathode of a blue subpixel may be formed to have a larger thickness than the thickness of a subcathode of a subpixel for different (red or green) color light to increase the intensity of light emission by resonance, and the emission efficiency of blue light may consequently improve. Accordingly, the emission efficiency of white light or full-color light may be improved.

When the cathode is formed of silver (Ag), the transmittance of light may be improved because Ag is a metal with low optical absorption. In an implementation, the cathode may be formed of a transparent, conductive metal oxide, e.g., ITO or IZO. In this case, the cathode may also allow light to pass through in the emission region E, but may have a reduced sheet resistance in the non-emission region N with or at the overlapping region OV. When the cathode is formed of such a transparent, conductive metal oxide, the thickness of the cathode may be larger than that of a metal cathode. For example, the first, second, and third subcathodes 131a, 131b, and 131c may be formed of a transparent conductive metal oxide to have a thickness of about 50 Å to about 1,000 Å.

In an implementation, to facilitate the injection of electrons from the cathode, the organic layer 121 may include an EIL that is formed of, e.g., a rare earth metal, an alkali metal, or an alkali earth metal.

The cathode may have a sheet resistance of, e.g., about 0.1Ω/sq to about 30Ω/sq.

The reduced sheet resistance of the cathode, due to the presence of the overlapping region OV, may help improve the rate of charge injection into the organic layer 121, and consequently the emission efficiency of the organic light-emitting device 100.

Figure 2:
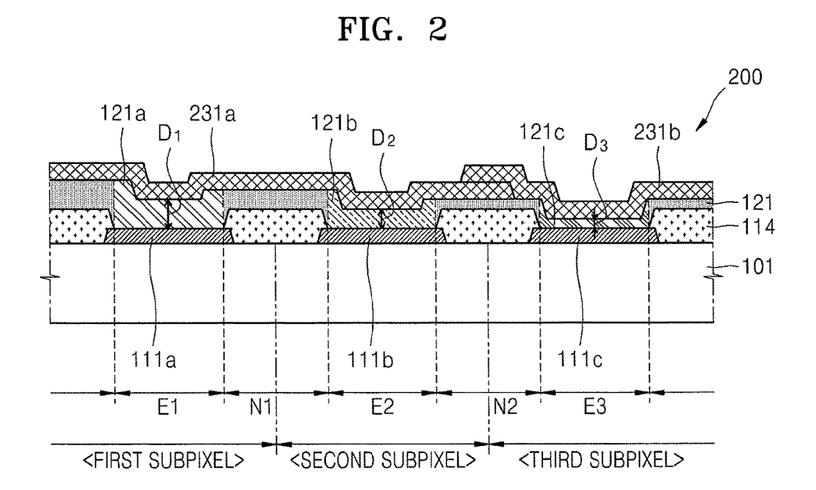
FIG. 2 illustrates a schematic cross-sectional view of an organic light-emitting device according to another embodiment.

FIG. 2 illustrates a schematic cross-sectional view of an organic light-emitting device 200 according to another embodiment. Referring to FIG. 2, the organic light-emitting device 200 differs from the organic light-emitting device 100 of FIG. 1 in that each subcathode may correspond to a plurality of subpixels, e.g., not to only one subpixel. In the organic light-emitting device of FIG. 2, a subcathode 231a may be disposed over a first subpixel and a second subpixel, and may overlap with or underlie a subcathode 231b in a non-emission region N2. In the organic light-emitting device 200 of FIG. 2, a substrate 101, an anode, a pixel defining layer 114, an organic layer 121, $D_1$, $D_2$, and $D_3$ may be the same as those described above in conjunction with the organic light-emitting device 100 of FIG. 1.

The number of subpixels corresponding to each subcathode may vary depending on a degree of resolution of a target organic light-emitting device. The larger the degree of resolution of the organic light-emitting device, the smaller the sizes of the subpixels, the larger the number of the subpixels, and consequently, the larger the number of the subpixels corresponding to each subcathode may become. For example, one subcathode may correspond to 2 to 10 subpixels. However, the number of subpixels corresponding to each subcathode is not limited thereto.

Figure 3:
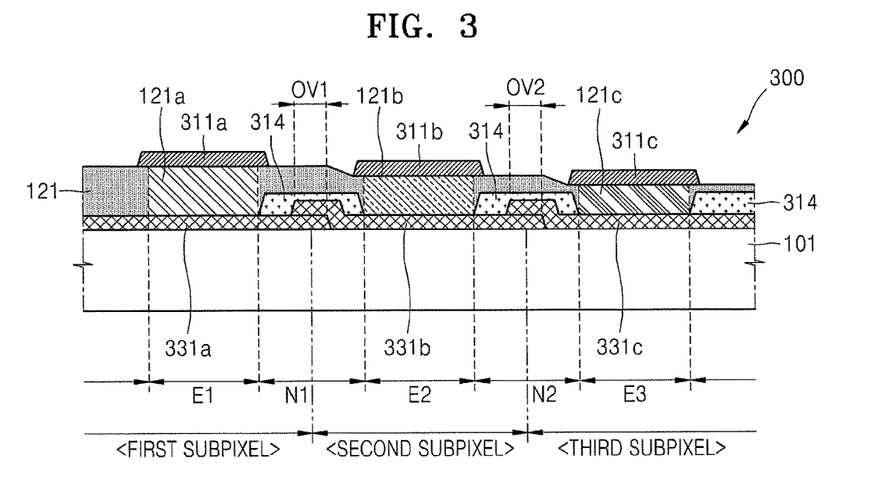
FIG. 3 illustrates a schematic cross-sectional view of an organic light-emitting device according to another embodiment.

FIG. 3 illustrates a schematic cross-sectional view of an organic light-emitting device 300 according to another embodiment. Referring to FIG. 3, unlike the organic light-emitting device 100 of FIG. 1, the organic light-emitting device 300 may be an inverted organic light-emitting device in which a cathode is on a substrate 101, and an anode is on an organic layer 121. In FIG. 3, reference numeral 314 denotes a pixel defining layer.

In the organic light-emitting device 300 of FIG. 3, the cathode on the substrate 101 may include subcathodes 331a, 331b, and 331c that correspond to first, second, and third subpixels, respectively, and overlap. Edge portions of the adjacent subcathodes 331a and 331b may overlap to form an overlapping region OV1 in a non-emission region N1. The edge portion of the subcathode 331a may extend into the non-emission region N1 of the second subpixel, but not into an emission region E2 of the second subpixel. Similarly, edge portions of the adjacent subcathodes 331b and 331c may overlap to form an overlapping region OV2 in a non-emission region N2. The edge portion of the subcathode 331c may extend into the non-emission region N2 of the second subpixel, but not into an emission region E2 of the second subpixel. In an implementation, the subcathodes 331a, 331b, and 331c that form the cathode of the organic light-emitting device 300 may each be disposed to correspond to a plurality of subpixels, as in the organic light-emitting device 200 described above.

In the organic light-emitting device 300, materials and thicknesses of the subcathodes 331a, 331b, and 331c may be the same as those of the subcathodes 131a, 131b, and 131c of the organic light-emitting device 100 described above. The substrate 101, the organic layer 121, $D_1$, $D_2$, $D_3$, and the anode may be the same as or similar to the substrate 101, the organic layer 121, $D_1$, $D_2$, $D_3$, and the anode of the organic light-emitting device 100 described above. The organic light-emitting device 300 may be a bottom-emission light-emitting device or a double-sided light-emitting device depending on the degree of transmittance of the anode.

Figure 4:
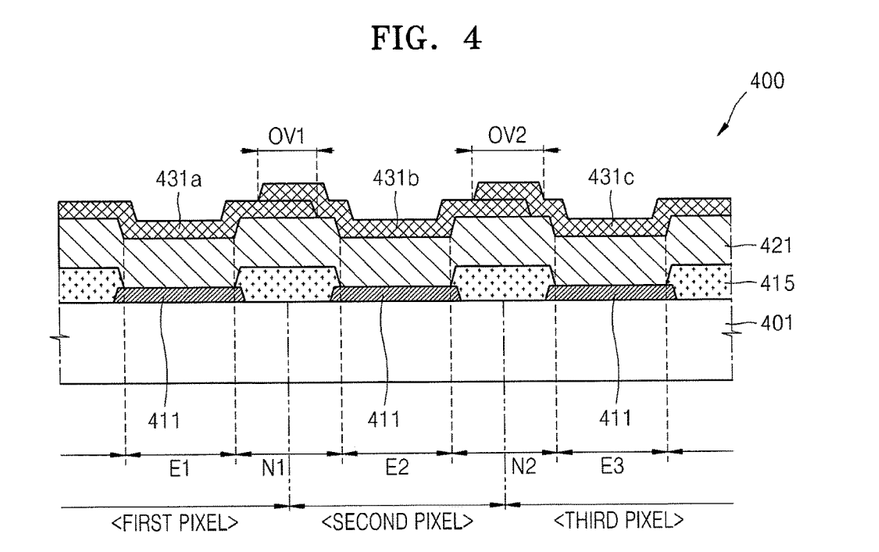
FIG. 4 illustrates a schematic cross-sectional view of an organic light-emitting device according to another embodiment.

FIG. 4 illustrates a schematic cross-sectional view of an organic light-emitting device 400 according to another embodiment. The organic light-emitting device 400 may be a white light-emitting device in which anodes 411 are disposed to respectively correspond to a plurality of pixels for emitting white light, rather than subpixels for emitting light of different colors. In an implementation, the organic light-emitting device 400 may include a plurality of subpixels with color filters or color conversion layers in each of the pixels. In this case, the anodes 411 may be disposed to respectively correspond to the subpixels.

An organic layer 421 of the organic light-emitting device 400 may include an emission layer (EML) for emitting white light that is common to the pixels, instead of a plurality of emission units that are disposed to respectively correspond to the subpixels to emit light of different colors. The EML of the organic layer 421 may include, e.g., a host, a red dopant, a green dopant, and a blue dopant in a single-layer structure thereof. The dopant in the EML of the organic layer 421 may be a combination of different-color dopants for emitting white light.

The cathode may include subcathodes 431a, 431b, and 431c that correspond to the first, second, and third pixels and that overlap. When the organic light-emitting device 400 includes a plurality of subpixels, the cathodes may include subcathodes that respectively correspond to the subpixels and that overlap. Due to the overlapping of the subcathodes 431a, 431b, and 431c, the cathode may have a reduced sheet resistance, and the range of charge injection into the organic layer 421 may be improved, thereby improving the emission efficiency of the organic light-emitting device 400.

In the organic light-emitting device 400, a substrate 401, the anodes 411, a pixel defining layer 415, other layers (excluding the EML) in the organic layer 421, and the cathode may also be the same as or similar to the substrate 101, the anodes, the pixel defining layer 114, other layers (excluding the EML) in the organic layer 121, and the cathode of the organic light-emitting device 100 described above with reference to FIG. 1.

Figure 5:
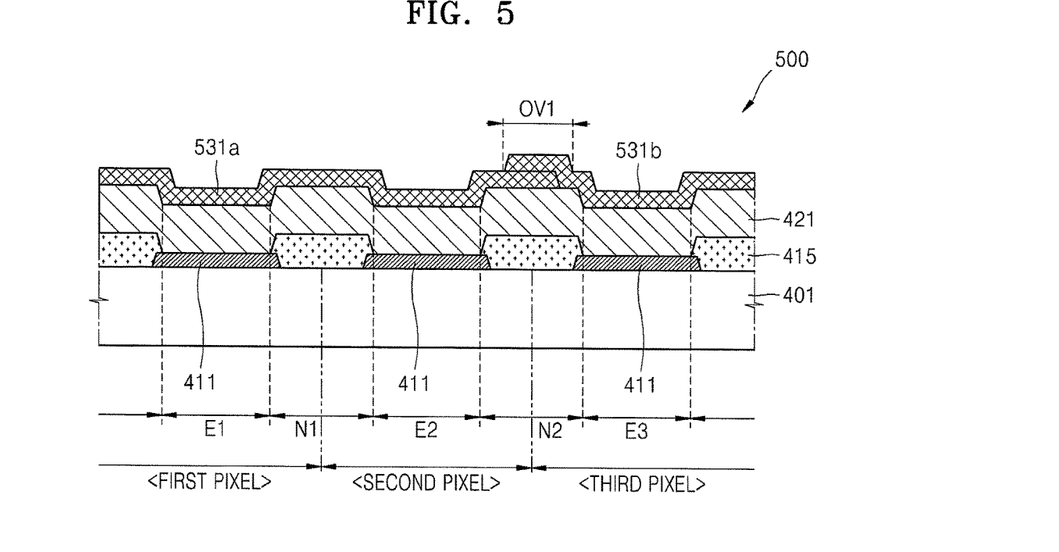
FIG. 5 illustrates a schematic cross-sectional view of an organic light-emitting device according to another embodiment.

FIG. 5 illustrates a schematic cross-sectional view of an organic light-emitting device 500 according to another embodiment. Referring to FIG. 5, the organic light-emitting device 500 may differ from the organic light-emitting device 400 of FIG. 4 in that each subcathode corresponds to a plurality of pixels, rather than to one pixel. In the organic light-emitting device 500 of FIG. 5, a subcathode 531a may be disposed or extend over a first pixel and a second pixel to overlap with or overlie a subcathode 531b in a non-emission region N2 at a border between the second pixel and the third pixel.

In the organic light-emitting device 500 of FIG. 5, a substrate 401, anodes 411, a pixel defining layer 415, an organic layer 421, and a cathode may be the same as or similar to the substrate 401, the anodes 411, the pixel defining layer 415, the organic layer 421, and the cathode of the organic light-emitting device 400 described above with reference to FIG. 4.

Figure 6:
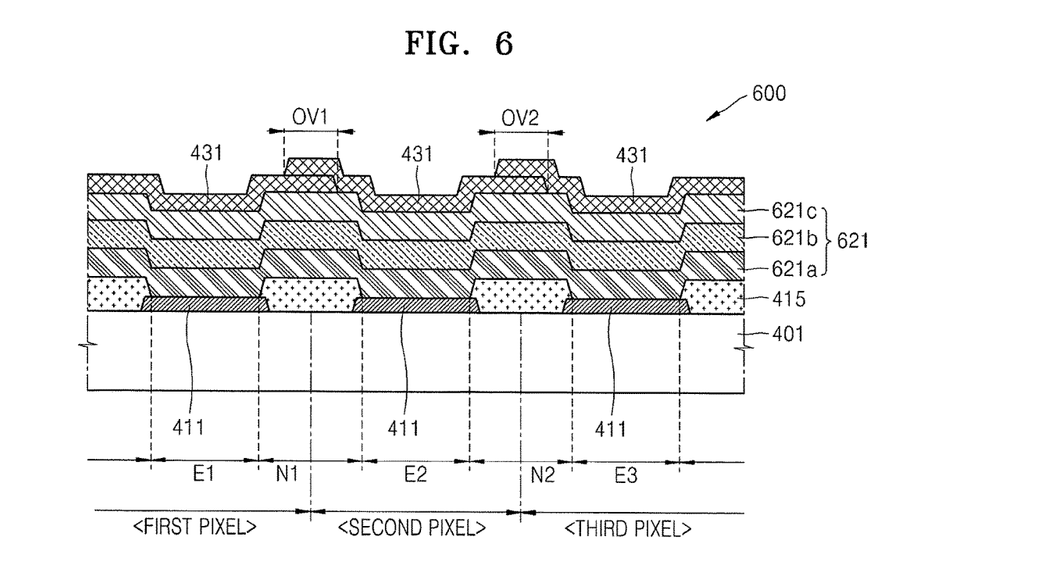
FIG. 6 illustrates a schematic cross-sectional view of an organic light-emitting device according to another embodiment.

FIG. 6 illustrates a schematic cross-sectional view of an organic light-emitting device 600 according to another embodiment. Referring to FIG. 6, the organic light-emitting device 600 may differ from the organic light-emitting device 400 of FIG. 4 in that an organic layer 621 may include a plurality of EMLs 621a, 621b, and 621c stacked upon one another to emit different-color lights. The organic light-emitting device 600 may emit white light by combination of the different-color lights emitting from the stacked EMLs 621a, 621b, and 621c. For example, the EML 621a may emit red light, the EML 621b may emit green light, and the EML 621c may emit blue light. However, embodiments are not limited thereto. For example, the EMLs 621a, 621b, and 621c may each independently emit any colors of light, not limited to red, green, and blue, in any order. In an implementation, the EML 621 may include two EMLs, unlike in FIG. 6, to emit white color by combination of different-color lights emitted from the two EMLs. Although not illustrated in FIG. 6, the organic layer 621 may further include a layer, in addition to the EML 621 (EMLs 621a, 621b, and 621c), e.g., a hole transport layer (HTL) or an electron transport layer (ETL).

In the organic light-emitting device 600 of FIG. 6, the substrate 401, the anodes 411, the pixel defining layer 415, other layers (excluding the EML) in the organic layer 621, and the cathode 431 may be the same as or similar to those of the organic light-emitting device 400 described above with reference to FIG. 4.

Figure 7:
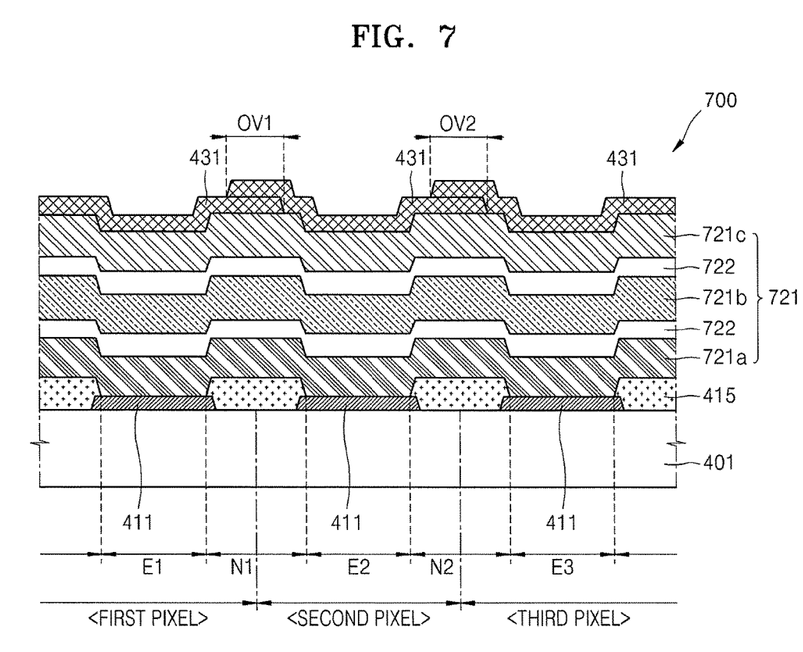
FIG. 7 illustrates a schematic cross-sectional view of an organic light-emitting device according to another embodiment.

FIG. 7 illustrates a schematic cross-sectional view of an organic light-emitting device 700 according to another embodiment. Referring to FIG. 7, unlike the organic light-emitting device 400 of FIG. 4, the organic light-emitting device 700 may be a tandem organic light-emitting device in which an organic layer 721 may include a plurality of emission units 721a, 721b, and 721c, as well as intermediate connection layers 722. The organic light-emitting device 700 may emit white light by combination of different-color lights emitted from the plurality of emission unit 721a, 721b, and 721c. For example, the emission unit 721a may emit red light, the emission unit 721b may emit green light, and the emission unit 721c may emit blue light. However, embodiments are not limited thereto. For example, the emission units 721a, 721b, and 721c may each independently emit any colors of light, not limited to red, green, and blue, in any order. In an implementation, the organic layer 721 may include two emission units, unlike in FIG. 7, to emit white color by combination of different-color lights emitted from the two emission units. Although not illustrated in FIG. 7, each of the emission units 721a, 721b, 721c may further include at least one layer of a hole injection layer (HIL), a hole transport layer (HTL), a buffer layer, an electron blocking layer (EBL), a hole blocking layer (HBL), an electron transport layer (ETL), and an electron injection layer (EIL), in addition to an EML.

The intermediate connection layers 722 may include, e.g., a charge-generation layer (CGL), or a PN junction layer.

In the organic light-emitting device 700 of FIG. 7, the substrate 401, the anodes 411, the pixel defining layer 415, other layers (excluding the emission units) in the organic layer 721, and the cathode 431 may be the same as or similar to those of the organic light-emitting device 400 described above with reference to FIG. 4.

Figure 8:
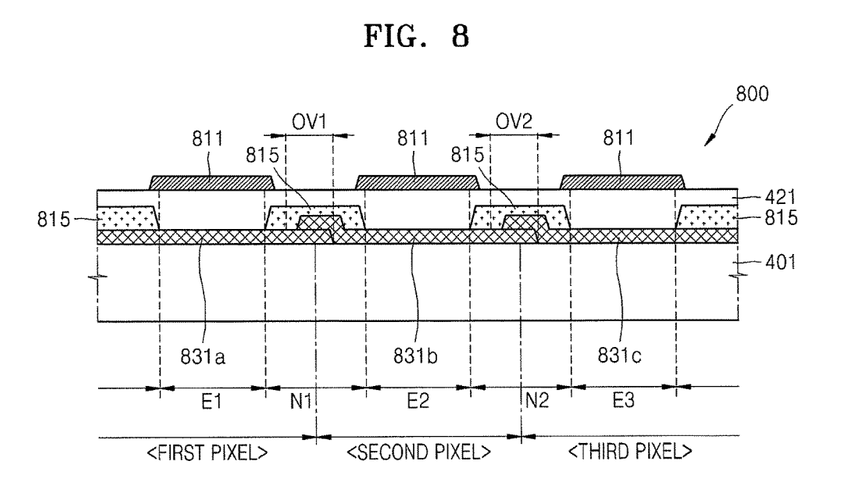
FIG. 8 illustrates a schematic cross-sectional view of an organic light-emitting device according to another embodiment.

FIG. 8 illustrates a schematic cross-sectional view of an organic light-emitting device 800 according to another embodiment. Referring to FIG. 8, unlike the organic light-emitting device 400 of FIG. 4, the organic light-emitting device 800 may be an inverted organic light-emitting device in which a cathode is on a substrate 401, and an anode 811 is on an organic layer 421. In FIG. 8, reference numeral 815 denotes a pixel defining layer.

In the organic light-emitting device 800 of FIG. 8, the cathode on the substrate 401 may include subcathodes 831a, 831b, and 831c that correspond to first, second, and third pixels, respectively, and that overlap. Edge regions of the adjacent subcathodes 831a and 831b may overlap to form an overlapping region OV1 in a non-emission region N1. The edge portion of the subcathode 831a may extend into the non-emission region N1 of the second pixel, but not into an emission region E2 of the second pixel. Similarly, edge portions of the adjacent subcathodes 831b and 831c may overlap to form an overlapping region OV2 in a non-emission region. The edge portion of the subcathode 831c may extend into the non-emission region N2 of the second pixel, but not into the emission region E2 of the second pixel. In an implementation, the subcathodes 831a, 831b, and 831c that form the cathode of the organic light-emitting device 800 may each correspond to a plurality of the pixels, as in the organic light-emitting device 500 described above.

In the organic light-emitting device 800, materials and thicknesses of the subcathodes 831a, 831b, and 831c may be the same as or similar to those of the subcathodes 431a, 431b, and 431c of the organic light-emitting device 400 described above, and substrate 401, the organic layer 421, and the anode 811 may be the same as those (the substrate 401, the organic layer 421, and the anode 411 of the organic light-emitting device 400 described above. The organic light-emitting device 800 may be a bottom-emission light-emitting device or a double-sided light-emitting device depending on the degree of transmittance of the anode 811.

Figure 9:
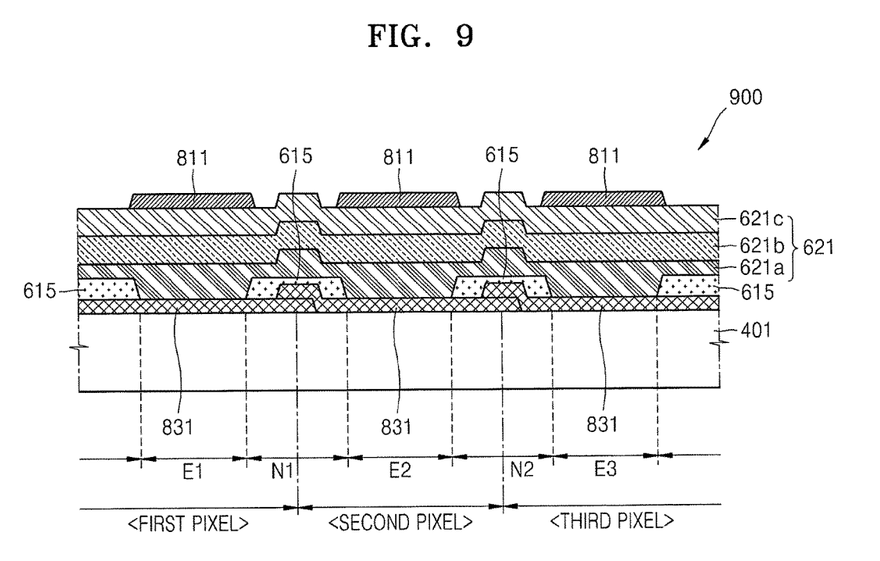
FIG. 9 illustrates a schematic cross-sectional view of an organic light-emitting device according to another embodiment.

FIG. 9 illustrates a schematic cross-sectional view of an organic light-emitting device 900 according to another embodiment. Referring to FIG. 9, the organic light-emitting device 900 may differ from the organic light-emitting device 800 of FIG. 8 in that an organic layer 621 may include a plurality of EMLs 621a, 621b, and 621c that are stacked upon one another. The organic layer 621 of the organic light-emitting device 900 may be the same as that of the organic light-emitting device 600 described above with reference to FIG. 6. In FIG. 9, reference numeral 615 denotes a pixel defining layer.

In the organic light-emitting device 900 of FIG. 9, the substrate 401, the cathode 831, and the anode 811 may be the same as or similar to those of the organic light-emitting device 800 described above with reference to FIG. 8.

Figure 10:
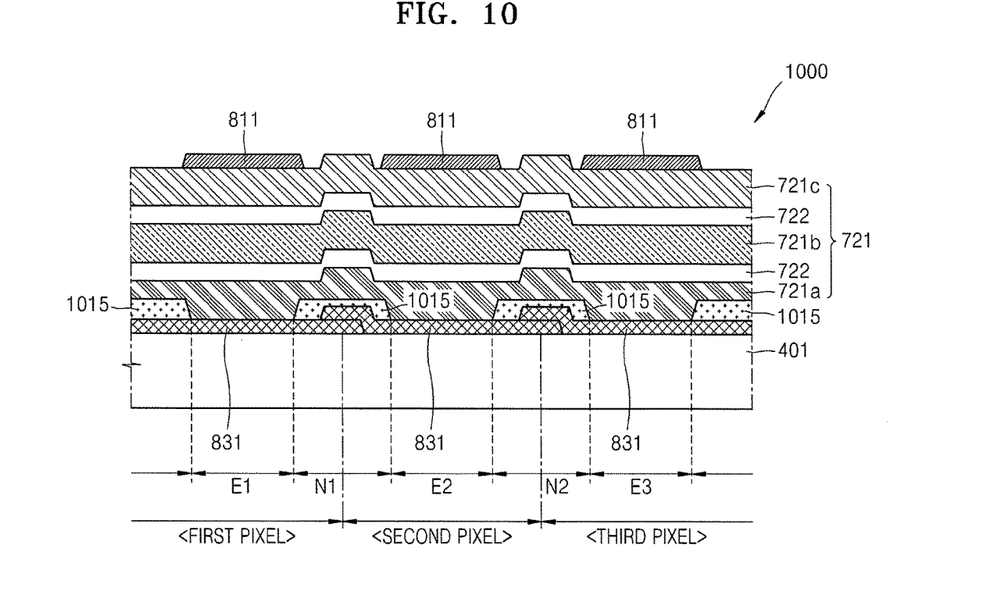
FIG. 10 illustrates a schematic cross-sectional view of an organic light-emitting device according to another embodiment.

FIG. 10 illustrates a schematic cross-sectional view of an organic light-emitting device 1000 according to another embodiment. Referring to FIG. 10, unlike the organic light-emitting device 800 of FIG. 8, the organic light-emitting device 1000 may be a tandem organic light-emitting device in which an organic layer 721 includes a plurality of emission units 721a, 721b, and 721c, as well as intermediate connection layers 722.

In the organic light-emitting device 1000 of FIG. 10, the plurality of emission units 721a, 721b, and 721c, and the intermediate connection layers 722 may be the same as or similar to those of the organic light-emitting device 700 described above with reference to FIG. 7. The substrate 401, the cathode 831, and the anode 811 in the organic light-emitting device 1000 of FIG. 10 may be the same as or similar to those of the organic light-emitting device 800 described above with reference to FIG.8. In FIG. 10, reference numeral 1015 denotes a pixel defining layer.

In the organic light-emitting devices according to the above-described embodiments, due to the overlapping of the subcathodes, the cathode may have a reduced sheet resistance, and the rate of charge injection into the organic layer may be improved. Accordingly, the organic light-emitting devices may have improved emission efficiency.

An organic light-emitting device according to any of the embodiments may be used in various apparatuses, e.g., in a display or lighting equipment.

The following Examples and Comparative Examples are provided in order to highlight characteristics of one or more embodiments, but it will be understood that the Examples and Comparative Examples are not to be construed as limiting the scope of the embodiments. Further, it will be understood that the embodiments are not limited to the particular details described in the Examples and Comparative Examples.

EXAMPLE 1

An anode including Ag/ITO (1,000 Å/100 Å) was formed on a glass substrate.

Next, m-MTDATA was vacuum-deposited on the anode and the glass substrate to form a HIL, and then α-NPD was vacuum-deposited on the HIL to form a HTL. A red EML was formed using 94 wt % of CBP as a host and 6 wt % of PtOEP as a dopant in a red subpixel region of the HTL, and a green EML was formed using 93 wt % of BCP as a host and 7 wt % of Ir(ppy)$_3$ as a dopant in a green subpixel region of the HTL. A blue EML was formed using 96 wt % of ADN as a host and 4 wt % of DPAVBi as a dopant in a blue subpixel region of the HTL.

After Alq$_3$ was vacuum-deposited on the EML to form an ETL, LiF was deposited on the ETL to form an EIL, and then Ag was deposited on the EIL to form a 130 Å thick cathode as a pattern corresponding to individual subpixels, overlapping between the subpixels, thereby completing the manufacture of an organic light-emitting device. For example, the thickness of the overlapping portion of the cathode was 260 Å.

COMPARATIVE EXAMPLE 1

An organic light-emitting device was manufactured in the same manner as in Example 1, except that Ag was continuously deposited to form a cathode as a common layer having a 130 Å thickness in common with the individual subpixels, rather than as a pattern corresponding to the subpixels.

The sheet resistances of the cathodes of the organic light-emitting devices of Example 1 and Comparative Example 1, and the emission efficiencies thereof are shown in Table 1, below.

TABLE 1

| Example | Cathode (thickness) | Cathode overlapping | Cathode sheet resistance | Emission efficiency (@ 10 mA/m²) |
|---|---|---|---|---|
| Example 1 | Ag (130 Å) | ○ | 3 Ω/sq | 30 Cd/A |
| Comparative Example 1 | Ag (130 Å) | x | 50 Ω/sq | 25.1 Cd/A |

Referring to Table 1, the organic light-emitting device of Example 1 was found to have a remarkably low cathode sheet resistance of about 3Ω/sq, compared to the organic light-emitting device of Comparative Example 1 having a cathode sheet resistance of about 50Ω/sq. The organic light-emitting device of Example 1 also had a higher white-light emission efficiency of about 30 Cd/A, compared to the organic light-emitting device of Comparative Example 1 having a white-light emission efficiency of about 25.1 Cd/A.

By way of summation and review, with the increasing size of an organic light-emitting device, a common electrode of the organic light-emitting device may have poor sheet resistance characteristics, and a voltage drop may occur in pixels that are relatively further away from a voltage source, and luminance may be lowered. The power consumption may be increased to help prevent these phenomena.

The embodiments may provide an organic light-emitting device with reduced electrode sheet resistance.

The embodiments may provide an organic light-emitting device having a reduced cathode sheet resistance and a high efficiency.

As described above, according to the one or more of the above embodiments, an organic light-emitting device may include cathodes overlapping with one another in non-emission regions of subpixels. Due to the overlapping of the cathodes, the organic light-emitting device may have a reduced cathode sheet resistance, and thus may have a high efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device with a plurality of subpixels, each subpixel including an emission region and a non-emission region, the organic light-emitting device comprising:
a substrate;
an anode on the substrate, the anode including patterns that separately correspond to respective subpixels of the plurality of subpixels;
an organic layer on the anode, the organic layer being common to the plurality of subpixels; and
a cathode on the organic layer, the cathode including a plurality of subcathodes that each correspond to at least one of the subpixels and that allow light to pass through in emission regions,
wherein two adjacent subcathodes overlap in non-emission regions.

2. The organic light-emitting device as claimed in claim 1, wherein the subcathodes each have a thickness of about 60 Å to about 200 Å.

3. The organic light-emitting device as claimed in claim 1, wherein the subcathodes include silver (Ag), magnesium-silver (Mg—Ag), magnesium (Mg), magnesium-indium (Mg—In), aluminum (Al), aluminum-lithium (Al—Li), lithium (Li), calcium (Ca), or a transparent conductive metal oxide.

4. The organic light-emitting device as claimed in claim 1, wherein the subcathodes include silver.

5. The organic light-emitting device as claimed in claim 1, wherein the anode is a reflective electrode or a semi-transmissive electrode.

6. The organic light-emitting device as claimed in claim 1, wherein the plurality of subpixels includes a red subpixel, a green subpixel, and a blue subpixel.

7. An organic light-emitting device with a plurality of subpixels, each subpixel including an emission region and a non-emission region, the organic light-emitting device comprising:
a substrate;
a cathode on the substrate, the cathode including a plurality of subcathodes that each correspond to at least one of the subpixels and that allow light to pass through in the emission regions,
wherein two adjacent subcathodes overlap in the non-emission regions;
an organic layer on the cathode, the organic layer being common to the plurality of subpixels; and
an anode on the organic layer, the anode including patterns that separately correspond to respective subpixels of the plurality of subpixels.

8. The organic light-emitting device as claimed in claim 7, wherein the subcathodes each have a thickness of about 60 Å to about 200 Å.

9. The organic light-emitting device as claimed in claim 7, wherein the subcathodes include silver (Ag), magnesium-silver (Mg—Ag), magnesium (Mg), magnesium-indium (Mg—In), aluminum (Al), aluminum-lithium (Al—Li), lithium (Li), calcium (Ca), or a transparent conductive metal oxide.

10. The organic light-emitting device as claimed in claim 7, wherein the anode is a reflective electrode or a semi-transmissive electrode.

11. An organic light-emitting device with a plurality of subpixels, each subpixel including an emission region and a non-emission region, the organic light-emitting device comprising:
a substrate;
an anode on the substrate;
an organic layer on the anode, the organic layer emitting white light; and
a cathode on the organic layer, the cathode corresponding to at least one of the subpixels and allowing light to pass through in the emission regions, wherein the cathode overlaps another adjacent cathode in the non-emission region.

12. The organic light-emitting device as claimed in claim 11, wherein the cathode includes silver (Ag), magnesium-silver (Mg—Ag), magnesium (Mg), magnesium-indium (Mg—In), aluminum (Al), aluminum-lithium (Al—Li), lithium (Li), calcium (Ca), or a transparent conductive metal oxide.

13. The organic light-emitting device as claimed in claim 11, wherein the anode is a reflective electrode or a semi-transmissive electrode.

14. The organic light-emitting device as claimed in claim 11, wherein the organic layer includes a single emission layer emitting white light.

15. The organic light-emitting device as claimed in claim 11, wherein:
the organic layer includes a plurality of emission layers stacked between the anode and the cathode, the plurality of emission layers emitting light of different colors, and
a combination of the light of different colors emitted from the plurality of emission layers is white light.

16. The organic light-emitting device as claimed in claim 15, wherein the organic layer includes:
an intermediate connection layer between the plurality of emission layers.

17. An organic light-emitting device with a plurality of subpixels, each subpixel including an emission region and a non-emission region, the organic light-emitting device comprising:
a substrate;
a cathode on the substrate, the cathode corresponding to at least one of the subpixels and allowing light to pass through in the emission regions, wherein the cathode overlaps another adjacent cathode in the non-emission regions;
an organic layer on the cathode, the organic layer emitting white light; and
an anode on the organic layer.

18. The organic light-emitting device as claimed in claim 17, wherein the organic layer includes a single emission layer emitting white light.

19. The organic light-emitting device as claimed in claim 17, wherein:
the organic layer includes a plurality of emission layers stacked between the anode and the cathode, the plurality of emission layers emitting light of different colors, and
a combination of the light of different colors emitted from the plurality of emission layers is white light.

20. The organic light-emitting device as claimed in claim 19, wherein the organic layer includes:
an intermediate connection layer between the plurality of emission layers.

* * * * *